United States Patent
Iwano

(10) Patent No.: US 11,566,150 B2
(45) Date of Patent: Jan. 31, 2023

(54) SLURRY AND POLISHING METHOD

(71) Applicant: HITACHI CHEMICAL COMPANY, LTD., Tokyo (JP)

(72) Inventor: Tomohiro Iwano, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 16/497,512

(22) PCT Filed: Mar. 27, 2017

(86) PCT No.: PCT/JP2017/012428
§ 371 (c)(1),
(2) Date: Sep. 25, 2019

(87) PCT Pub. No.: WO2018/179064
PCT Pub. Date: Oct. 4, 2018

(65) Prior Publication Data
US 2021/0207002 A1    Jul. 8, 2021

(51) Int. Cl.
*C09G 1/02* (2006.01)
*H01L 21/321* (2006.01)
*C01F 17/235* (2020.01)

(52) U.S. Cl.
CPC ............ *C09G 1/02* (2013.01); *H01L 21/3212* (2013.01); *C01F 17/235* (2020.01)

(58) Field of Classification Search
None
See application file for complete search history.

(56) References Cited

U.S. PATENT DOCUMENTS

| 5,543,126 A | 8/1996 | Ota |
| 6,939,211 B2 | 9/2005 | Taylor |
| 7,112,123 B2 | 9/2006 | Fang |
| 2004/0065022 A1 | 4/2004 | Machii |
| 2004/0152309 A1 | 8/2004 | Carter |
| 2005/0119360 A1 | 6/2005 | Kawakami |
| 2007/0044385 A1 | 3/2007 | Yamada |
| 2011/0275285 A1* | 11/2011 | Satou ............... H01L 21/31053 451/37 |

(Continued)

FOREIGN PATENT DOCUMENTS

| CN | 103189457 | 7/2013 |
| CN | 103339219 | 10/2013 |

(Continued)

OTHER PUBLICATIONS

"Glyceric acid," https://en.wikipedia.org/wiki/Glyceric_acid, 2021, p. 1-p. 2 (Cited in Office Action dated May 10, 2021 in U.S. Appl. No. 16/981,589).

(Continued)

*Primary Examiner* — Roberts P Culbert
(74) *Attorney, Agent, or Firm* — Fitch, Even, Tabin & Flannery, L.L.P.

(57) ABSTRACT

A slurry containing abrasive grains and a liquid medium, the abrasive grains including first particles and second particles being in contact with the first particles, the first particles containing ceria, the first particles having a negative zeta potential, the second particles containing a hydroxide of a tetravalent metal element, and the second particles having a positive zeta potential.

7 Claims, 2 Drawing Sheets

(56) References Cited

U.S. PATENT DOCUMENTS

| | | |
|---|---|---|
| 2012/0100718 A1 | 4/2012 | Minami |
| 2012/0129346 A1 | 5/2012 | Ryuzaki |
| 2012/0299158 A1 | 11/2012 | Shinoda |
| 2012/0329371 A1 | 12/2012 | Iwano |
| 2013/0161285 A1 | 6/2013 | Li |
| 2015/0140904 A1 | 5/2015 | Iwano |
| 2015/0232704 A1 | 8/2015 | Akutsu |
| 2015/0232705 A1 | 8/2015 | Kachi et al. |
| 2016/0024351 A1 | 1/2016 | Yoshida |
| 2016/0108284 A1 | 4/2016 | Yoshizaki |
| 2016/0137881 A1 | 5/2016 | Oota |
| 2016/0319159 A1 | 11/2016 | Minami |
| 2017/0183537 A1 | 6/2017 | Yoon |
| 2017/0183538 A1 | 6/2017 | Kwon |
| 2017/0292039 A1 | 10/2017 | Sato |
| 2018/0043497 A1 | 2/2018 | Hanano |
| 2018/0072917 A1 | 3/2018 | Kobayashi |
| 2019/0211245 A1 | 7/2019 | Choi |
| 2019/0256742 A1 | 8/2019 | Suzuki |
| 2020/0299544 A1 | 9/2020 | Hanano |
| 2021/0189175 A1 | 6/2021 | Gagliardi et al. |

FOREIGN PATENT DOCUMENTS

| | | |
|---|---|---|
| CN | 104334675 | 2/2015 |
| CN | 105895518 | 8/2016 |
| CN | 108010878 | 5/2018 |
| JP | H8-022970 A | 1/1996 |
| JP | H10-106994 A | 4/1998 |
| JP | 2005513765 | 5/2005 |
| JP | 2006-249129 A | 9/2006 |
| JP | 2007318072 | 12/2007 |
| JP | 2008112990 | 5/2008 |
| JP | 2009290188 | 12/2009 |
| JP | 2010153781 | 7/2010 |
| JP | 2011518098 | 6/2011 |
| JP | 4941430 | 5/2012 |
| JP | 2012186339 | 9/2012 |
| JP | 2013540851 | 11/2013 |
| JP | 201593932 | 5/2015 |
| JP | 2015137297 | 7/2015 |
| JP | 2016029123 | 3/2016 |
| JP | 2016538359 | 12/2016 |
| JP | 201752858 | 3/2017 |
| JP | 2017203076 | 11/2017 |
| JP | 2018044046 | 3/2018 |
| KR | 101737938 | 5/2017 |
| KR | 1020170097090 | 8/2017 |
| KR | 1020180029888 | 3/2018 |
| TW | 201518489 | 5/2015 |
| TW | 201518492 | 5/2015 |
| TW | 201525118 | 7/2015 |
| TW | 201610126 | 3/2016 |
| TW | 201816060 | 5/2018 |
| WO | 97029510 | 8/1997 |
| WO | 02/067309 A1 | 8/2002 |
| WO | 2008146641 | 12/2008 |
| WO | 2009131133 | 10/2009 |
| WO | 2010143579 | 12/2010 |
| WO | 2012/070541 A1 | 5/2012 |
| WO | 2012/070542 A1 | 5/2012 |
| WO | 2012/070544 A1 | 5/2012 |
| WO | 2013125441 | 8/2013 |
| WO | 2014199739 | 12/2014 |
| WO | 2014208414 | 12/2014 |
| WO | 2015052988 | 4/2015 |
| WO | 2015098197 | 7/2015 |
| WO | 2016006553 | 1/2016 |
| WO | 2016143797 | 9/2016 |
| WO | 201743139 | 3/2017 |
| WO | 2018012174 | 1/2018 |
| WO | 2018048068 | 3/2018 |

OTHER PUBLICATIONS

"Glycolic Acid," https://en.wikipedia.org/wiki/Glycolic_acid, 2021, p. 1-p. 5 (Cited in Office Action dated May 10, 2021 in U.S. Appl. No. 16/981,589).

"Lactic acid," https://en.wikipedia.org/wiki/Lactic_acid, 2021, p. 1-p. 11 (Cited in Office Action dated May 10, 2021 in U.S. Appl. No. 16/981,589).

"Wikipedia, "N-vinylpyrrolidone" via https://en.wikipedia.org/wiki/N-Vinylpyrrolidone", 2020, p. 1-p. 3 (cited in Office Action dated Mar. 9, 2021 in U.S. Appl. No. 16/981,589).

"Wikipedia, "Poly(N-vinylacetamide)" via https://en.wikipedia.org/wiki/Poly(N-vinylacetamide)", 2019, p. 1-p. 2 (cited in Office Action dated Mar. 9, 2021 in U.S. Appl. No. 16/981,589).

"Wikipedia, "Polyethylene glycol" via https://en.wikipedia.org/wiki/Polyethylene_glycol", 2021, p. 1-p. 11 (cited in Office Action dated Mar. 9, 2021 in U.S. Appl. No. 16/981,589).

"Wikipedia, "Tartaric acid" via https://en.wikipedia.org/wiki/Tartaric_acid", 2021, p. 1-p. 9 (cited in Office Action dated Mar. 9, 2021 in U.S. Appl. No. 16/981,589).

A. Solt, "13.1 Amino Acids," Chemistry Libre Texts, Chem.Libretext.org, 2021 (Cited in Office Action dated May 25, 2021 in U.S. Appl. No. 16/981,573).

International Search Report dated Aug. 1, 2019, for International Application No. PCT/JP2018/035441, together with English language translation.

International Search Report dated Aug. 1, 2019, for International Application No. PCT/JP2018/035463, together with English language translation.

International Search Report dated Sep. 24, 2019, for International Application No. PCT/JP2019/028712, together with English language translation.

International Search Report dated Dec. 25, 2018, for International Application No. PCT/JP2018/035443, together with English language translation.

International Search Report dated Dec. 11, 2018, for International Application No. PCT/JP2018/035456, together with English language translation.

Merrian Webster, Definition of "have," https://www.merriam-webster.com/dictionary/have, 2021, p. 1-p. 14 (Cited in Office Action dated May 10, 2021 in U.S. Appl. No. 16/981,589).

Written Opinion of the International Searching Authority dated Dec. 11, 2018, for International Application No. PCT/JP2018/035456, together with English language translation.

Written Opinion of the International Searching Authority dated Aug. 1, 2019, for International Application No. PCT/JP2018/035441, together with English language translation.

Written Opinion of the International Searching Authority dated Aug. 1, 2019, for International Application No. PCT/JP2018/035463, together with English language translation.

Written Opinion of the International Searching Authority dated Sep. 27, 2019, for International Application No. PCT/JP2019/028712, together with English language translation.

Written Opinion of the International Searching Authority dated Dec. 25, 2018, for International Application No. PCT/JP2018/035443, together with English language translation.

Merricks et al., "Evolution and Revolution of Cerium Oxide Slurries in CMP," Ferro Electronic Material Systems, 2015, pp. 1-6 (Cited in Office Action dated Mar. 10, 2022 in U.S. Appl. No. 16/981,560).

\* cited by examiner

SLURRY AND POLISHING METHOD

CROSS-REFERENCE TO RELATED APPLICATIONS

This application is a U.S. national phase application filed under 35 U.S.C. § 371 of International Application No. PCT/JP2017/012428, filed Mar. 27, 2017, designating the United States, which is hereby incorporated herein by reference in its entirety.

TECHNICAL FIELD

The present invention relates to a slurry and a polishing method. Particularly, the present invention relates to a slurry and a polishing method that are used for a flattening step of a base substrate surface, which is a production technology for semiconductor elements. More particularly, the present invention relates to a slurry and a polishing method that are used for a flattening step of a shallow trench isolation (hereinafter, referred to as "STI") insulating material, a pre-metal insulating material, an interlayer insulating material, and the like.

BACKGROUND ART

In the manufacturing steps for semiconductor elements of recent years, the importance of processing technologies for density increase and micronization is increasing more and more. CMP (Chemical mechanical polishing) technology, which is one of the processing technologies, has become an essential technology for the formation of STI, flattening of a pre-metal insulating material or an interlayer insulating material, formation of a plug or an embedded metal wiring, and the like in the manufacturing steps for semiconductor elements.

Regarding polishing liquids that are most commonly used, for example, silica-based polishing liquids containing silica (silicon oxide) particles such as fumed silica and colloidal silica as abrasive grains are mentioned. Silica-based polishing liquids have a feature of high flexibility of use, and by appropriately selecting the content of abrasive grains, pH, additives, and the like, polishing of a wide variety of materials can be achieved regardless of whether the material is an insulating material or an electroconductive material.

On the other hand, there is also an increasing demand for polishing liquids containing cerium compound particles as abrasive grains, as polishing liquids mainly intended for insulating materials such as silicon oxide. For example, cerium oxide-based polishing liquids containing cerium oxide (ceria) particles as abrasive grains can polish silicon oxide at high rate with even lower contents of abrasive grains than silica-based polishing liquids (see, for example, the following Patent Literatures 1 and 2).

Incidentally, in recent years, in the manufacturing steps for semiconductor elements, it is required to achieve further micronization of wiring, and polishing scratches generated during polishing are becoming problematic. That is, when polishing is performed using a conventional cerium oxide-based polishing liquid, even if minute polishing scratches are generated, there has been no problem as long as the sizes of the polishing scratches are smaller than conventional wiring widths; however, in a case in which it is directed to achieve further micronization of the wiring, even minute polishing scratches become problematic.

With regard to this problem, an investigation has been conducted on polishing liquids that use particles of a hydroxide of a tetravalent metal element (see, for example, the following Patent Literatures 3 to 5). Furthermore, methods for producing particles of a hydroxide of a tetravalent metal element have also been investigated (see, for example, the following Patent Literatures 6 and 7). These technologies are directed to reduce polishing scratches caused by particles, by making the mechanical action as small as possible while utilizing the chemical action of particles of a hydroxide of a tetravalent metal element.

CITATION LIST

Patent Literature

Patent Literature 1: Japanese Unexamined Patent Publication No. H10-106994
Patent Literature 2: Japanese Unexamined Patent Publication No. H08-022970
Patent Literature 3: International Publication WO 2002/067309
Patent Literature 4: International Publication WO 2012/070541
Patent Literature 5: International Publication WO 2012/070542
Patent Literature 6: Japanese Unexamined Patent Publication No. 2006-249129
Patent Literature 7: International Publication WO 2012/070544

SUMMARY OF INVENTION

Technical Problem

Incidentally, in recent years, 3D-NAND devices in which the cell portions of a device are laminated in the longitudinal direction have come to the fore. In the present technology, the level differences of the insulating materials during cell formation are several times higher compared to the conventional planar types. According to this, in order to maintain the throughput of the device production, it is necessary to rapidly resolve the high level differences as described above in a CMP step or the like, and it is necessary to increase the polishing rate for an insulating material.

The present invention is directed to solve the problems described above, and it is an object of the invention to provide a slurry capable of increasing the polishing rate for an insulating material, and a polishing method using the slurry.

Solution to Problem

The slurry of the present invention contains abrasive grains and a liquid medium, in which the abrasive grains include first particles and second particles being in contact with the first particles, the first particles contains ceria, the first particles have a negative zeta potential, the second particles contain a hydroxide of a tetravalent metal element, and the second particles have a positive zeta potential.

According to the slurry of the present invention, it is possible to increase the polishing rate for an insulating material, and therefore, an insulating material can be polished at a high polishing rate. According to the slurry of the present invention, in a CMP technology for flattening an STI insulating material, a pre-metal insulating material, an interlayer insulating material, and the like, these insulating materials can be flattened to a high level.

Incidentally, generally, as the content of abrasive grains is increased, polishing scratches tend to be generated easily. On the other hand, according to the slurry of the present invention, since a sufficient polishing rate can be obtained even with a small amount of abrasive grains, by using a small amount of abrasive grains, an insulating material can be polished with fewer polishing scratches while a sufficient polishing rate is achieved.

It is preferable that the hydroxide of a tetravalent metal element contains at least one selected from the group consisting of hydroxides of rare earth metal elements and hydroxide of zirconium. The zeta potential of the abrasive grains is preferably +10 mV or higher. The content of the abrasive particles is preferably 0.01% to 10% by mass.

An aspect of the present invention relates to the use of the slurry for polishing of a surface to be polished containing silicon oxide. That is, it is preferable that the slurry of the present invention is used for polishing a surface to be polished containing silicon oxide.

The polishing method of the present invention may include a step of polishing a surface to be polished using the slurry. According to such a polishing method, the above-described effects similar to those obtainable with the slurry of the present invention can be obtained by using the slurry.

Advantageous Effects of Invention

According to the present invention, a slurry capable of increasing the polishing rate for an insulating material (for example, silicon oxide) can be provided. According to the present invention, a polishing method using the slurry can be provided.

According to the present invention, in a CMP technology for flattening an STI insulating material, a pre-metal insulating material, an interlayer insulating material, and the like, these insulating materials can be flattened to a high level. Furthermore, according to the present invention, an insulating material can be polished with fewer polishing scratches while a sufficient polishing rate is achieved.

According to the present invention, use of a slurry for a flattening step of a base substrate surface can be provided. According to the present invention, use of a slurry for a flattening step of an STI insulating material, a pre-metal insulating material, or an interlayer insulating material can be provided.

DESCRIPTION OF EMBODIMENTS

Figure 1:
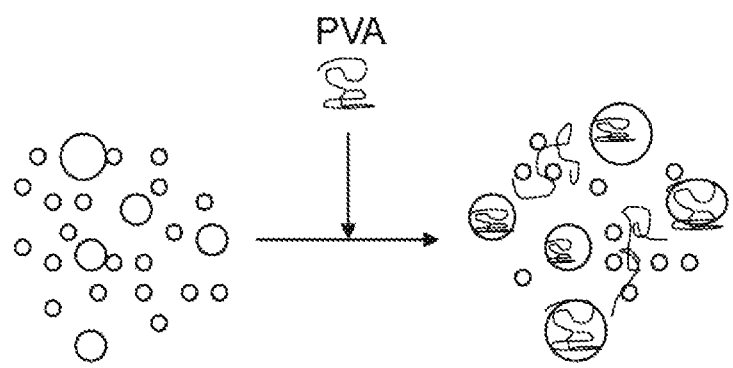
FIG. 1 is a schematic diagram illustrating the state in which abrasive grains aggregate when an additive is added.

In the following description, a slurry of embodiments of the present invention, and a polishing method using the slurry will be described in detail.

Definition

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage may be replaced with the upper limit value or the lower limit value of the numerical range of another stage. In the numerical ranges that are described in the present specification, the upper limit value or the lower limit value of the numerical value range may be replaced with the value shown in the examples. "A or B" may include either one of A and B, and may also include both of A and B. Materials listed as examples in the present specification can be used singly or in combinations of two or more, unless otherwise specifically indicated. In the present specification, when a plurality of substances corresponding to each component exist in the composition, the content of each component in the composition means the total amount of the plurality of substances that exist in the composition, unless otherwise specified.

As will be described below, the slurry of the present embodiment contains abrasive grains. The abrasive grains are also referred to as "abrasive particles"; however, in the present invention, the term "abrasive grains" is used. Abrasive grains are generally solid particles, and it is considered that at the time of polishing, an object to be removed is removed by a mechanical action of the abrasive grains and the chemical action of the abrasive grains (mainly the surface of the abrasive grains); however, it is not limited to this.

The weight average molecular weight in the present specification can be measured, for example, by gel permeation chromatography (GPC) using a calibration curve of polystyrene standards under the following conditions.

Equipment used: Hitachi L-6000 type [manufactured by Hitachi, Ltd.]

Column: GELPACK GL-R420+GELPACK GL-R430+GELPACK GL-R440 [manufactured by Hitachi Chemical Co., Ltd., trade names, three in total]

Eluent: Tetrahydrofuran

Measurement temperature: 40° C.

Flow rate: 1.75 mL/min

Detector: L-3300RI [manufactured by Hitachi, Ltd.]

<Slurry>

The slurry of the present embodiment contains abrasive grains and a liquid medium as essential components. The slurry of the present embodiment can be used as, for example, a polishing liquid (CMP polishing liquid). In the present specification, the term "polishing liquid" (polishing liquid, abrasive) is defined as a composition that is brought into contact with a surface to be polished during polishing. The phrase "polishing liquid" itself does not at all limit the components that are contained in the polishing liquid. In the following description, essential components and optional components will be described.

(Abrasive Grains)

Abrasive grains are composite particles including first particles and second particles that are in contact with the first particles. The first particles contain ceria, and the first particles in the slurry have a negative zeta potential. The second particles contain a hydroxide of a tetravalent metal element, and the second particles in the slurry have a positive zeta potential. By using such abrasive grains, the polishing rate for an insulating material can be increased. Regarding the reason why the polishing rate for an insulating material increases like this, for example, the following reasons may be mentioned. That is, the first particles (particles containing ceria) have strong physical action (mechanical performance) on an insulating material. On the other hand, the second particles (particles containing a hydroxide of a tetravalent metal element) have high reactivity with an insulating material based on chemical action (chemical performance). For example, hydroxyl groups act to obtain high reactivity between the second particles and an insulating material. Furthermore, in a case in which the force of electrostatically attracting an insulating material (for example, silicon oxide) is strong, high reactivity between the second particles and the insulating material is easily obtainable. Therefore, it is speculated that the polishing rate for an insulating material is increased by a synergistic effect obtainable by using the first particles having strong physical action and the second particles having strong chemical action.

Abrasive grains can be used singly or in combination of two or more kinds thereof. The slurry of the present embodiment may contain other particles other than the composite particles including the first particles and the second particles. Examples of such other particles include the first particles that are not in contact with the second particles; the second particles that are not in contact with the first particles; and particles composed of silica, alumina, zirconia, yttria, and the like (particles that do not include first particles and second particles).

The average particle size (average secondary particle size) of the first particles in the slurry is preferably in the following range. From the viewpoint that the polishing rate for an insulating material further increases, the lower limit of the average particle size of the first particles is preferably 15 nm or greater, more preferably 25 nm or greater, even more preferably 35 nm or greater, and particularly preferably 40 nm or greater. From the viewpoint that the dispersibility of the abrasive grains is enhanced, and from the viewpoint that scratching on the polished surface is further suppressed, the upper limit of the average particle size of the first particles is preferably 1000 nm or less, more preferably 800 nm or less, even more preferably 600 nm or less, and particularly preferably 500 nm or less. From the above-described viewpoints, the average particle size of the first particles is more preferably 15 to 1000 nm.

The average particle size (average secondary particles) of the second particles in the slurry is preferably in the following range. From the viewpoint that the polishing rate for an insulating material further increases, the lower limit of the average particle size of the second particles is preferably 1 nm or greater, more preferably 2 nm or greater, and even more preferably 3 nm or greater. From the viewpoint that the dispersibility of the abrasive grains is enhanced, and from the viewpoint that scratching on the polished surface is further suppressed, the upper limit of the average particle size of the second particles is preferably 25 nm or less, more preferably 20 nm or less, and even more preferably 15 nm or less. From the above-described viewpoints, the average particle size of the second particles is more preferably 1 to 25 nm.

It is preferable that the average particle size of the second particles is smaller than the average particle size of the first particles. Generally, particles having a small particle size have high reaction activity because the particles have a large surface area per unit mass compared to particles having a large particle size. On the other hand, the mechanical action (mechanical polishing power) of particles having a small particle size is lower compared to particles having a large particle size. However, in the present embodiment, in a case in which the average particle size of the second particles is smaller than the average particle size of the first particles, a synergistic effect of the first particles and the second particles can be easily exhibited, and a balance between excellent reaction activity and mechanical action can be easily achieved.

The average particle size (average secondary particle size) of the abrasive grains (entire abrasive grains including composite particles) in the slurry is preferably in the following range. From the viewpoint that the polishing rate for the insulating material is further increased, the lower limit of the average particle size of the abrasive grains is preferably 20 nm or larger, more preferably 30 nm or larger, even more preferably 40 nm or larger, particularly preferably 50 nm or larger, extremely preferably 100 nm or larger, highly preferably 120 nm or larger, still more preferably 150 nm or larger, even more preferably 200 nm or larger, and particularly preferably 300 nm or larger. From the viewpoint that the dispersibility of the abrasive grains is enhanced, and from the viewpoint that scratching on the polished surface is further suppressed, the upper limit of the average particle size of the abrasive grains is preferably 1000 nm or less, more preferably 800 nm or less, even more preferably 600 nm or less, particularly preferably 500 nm or less, and extremely preferably 400 nm or less. From the above-described viewpoints, the average particle size of the abrasive grains is more preferably 20 to 1000 nm.

The average particle size can be measured using, for example, a light diffraction scattering type particle size distribution meter (for example, manufactured by Beckman Coulter, Inc., trade name: N5, or manufactured by MicrotracBEL Corp., trade name: MICROTRAC MT3300EXII).

The first particles in the slurry have a negative zeta potential from the viewpoint of causing the first particles and the second particles to appropriately act in order to increase the polishing rate for an insulating material. From the viewpoint that the polishing rate for an insulating material further increases, the upper limit of the zeta potential of the first particles in the slurry is preferably −20 mV or lower, more preferably −25 mV or lower, even more preferably −30 mV or lower, and particularly preferably −35 mV or lower. The lower limit of the zeta potential of the first particles is not particularly limited and is, for example, −200 mV or higher.

The second particles in the slurry have a positive zeta potential from the viewpoint of causing the second particles and the first particles to appropriately act in order to increase the polishing rate for an insulating material. From the viewpoint that the polishing rate for an insulating material further increases, the lower limit of the zeta potential of the second particles in the slurry is preferably +20 mV or higher, more preferably +25 mV or higher, even more preferably +30 mV or higher, and particularly preferably +35 mV or higher. The upper limit of the zeta potential of the second particles is not particularly limited and is, for example, +200 mV or lower.

From the viewpoint that the polishing rate for an insulating material further increases, the lower limit of the zeta potential (zeta potential of the entire abrasive grains) of the abrasive grains (abrasive grains including composite particles) in the slurry is preferably +10 mV or higher, more preferably +20 mV or higher, even more preferably +25 mV or higher, particularly preferably +30 mV or higher, extremely preferably +40 mV or higher, and highly preferably +50 mV or higher. The upper limit of the zeta potential of the abrasive grains is not particularly limited and is, for example, +200 mV or lower.

The zeta potential represents the surface potential of a particle. The zeta potential can be measured using, for example, a dynamic light scattering type zeta potential analyzer (for example, manufactured by Beckman Coulter, Inc., trade name: DelsaNano C). The zeta potential of the particles can be adjusted using an additive. For example, particles having a negative zeta potential can be obtained by bringing particles containing ceria into contact with a material having a carboxyl group (polyacrylic acid or the like).

From the viewpoint that the polishing rate for the insulating material further increases, the lower limit of the content of ceria in the abrasive grains is preferably 50% by mass or more, more preferably 60% by mass or more, even more preferably 70% by mass or more, and particularly preferably 80% by mass or more, on the basis of the entire abrasive grains (entire abrasive grains contained in the slurry; hereinafter, the same). From the viewpoint that the polishing rate for an insulating material further increases, the upper limit of the content of ceria in the abrasive grains is preferably 95% by mass or less, more preferably 92% by mass or less, even more preferably 90% by mass or less, particularly preferably 88% by mass or less, and extremely preferably 85% by mass or less, on the basis of the entire abrasive grains. From the above-described viewpoints, the content of ceria in the abrasive grains is more preferably 50% to 95% by mass on the basis of the entire abrasive grains.

From the viewpoint that the polishing rate for an insulating material further increases, the lower limit of the content of ceria in the first particles is preferably 50% by mass or more, more preferably 70% by mass or more, even more preferably 90% by mass or more, and particularly preferably 95% by mass or more, on the basis of the entire first particles (entire first particles contained in the slurry; hereinafter, the same). The first particles may also be an embodiment substantially composed of ceria (embodiment in which substantially 100% by mass of the first particles is ceria).

From the viewpoint that the polishing rate for an insulating material further increases, the lower limit of the content of the first particles is preferably 0.01% by mass or more, more preferably 0.05% by mass or more, even more preferably 0.1% by mass or more, particularly preferably 0.3% by mass or more, extremely preferably 0.4% by mass or more, and highly preferably 0.5% by mass or more, on the basis of the total mass of the slurry. From the viewpoint of increasing the storage stability of the slurry, the upper limit of the content of the first particles is preferably 10% by mass or less, more preferably 5% by mass or less, and even more preferably 1% by mass or less, on the basis of the total mass of the slurry. From the above-described viewpoints, the content of the first particles is more preferably 0.01% to 10% by mass on the basis of the total mass of the slurry.

From the viewpoint that the polishing rate for an insulating material further increases, the lower limit of the content of the hydroxide of a tetravalent metal element in the abrasive grains is preferably 5% by mass or more, more preferably 8% by mass or more, even more preferably 10% by mass or more, particularly preferably 12% by mass or more, and extremely preferably 15% by mass or more, on the basis of the entire abrasive grains (entire abrasive grains contained in the slurry). From the viewpoint that preparation of the slurry is easy and polishing characteristics are further excellent, the upper limit of the content of the hydroxide of a tetravalent metal element in the abrasive grains is preferably 50% by mass or less, more preferably 40% by mass or less, even more preferably 30% by mass or less, and particularly preferably 20% by mass or less, on the basis of the entire abrasive grains. From the above-described viewpoints, the content of the hydroxide of a tetravalent metal element in the abrasive grains is more preferably 5% to 50% by mass on the basis of the entire abrasive grains.

From the viewpoint that the polishing rate for an insulating material further increases, the lower limit of the content of the hydroxide of a tetravalent metal element in the second particles is preferably 50% by mass or more, more preferably 70% by mass or more, even more preferably 90% by mass or more, and particularly preferably 95% by mass or more, on the basis of the entire second particles (entire second particles contained in the slurry; hereinafter, the same). The second particles may be an embodiment substantially composed of a hydroxide of a tetravalent metal element (embodiment in which substantially 100% by mass of the second particles is a hydroxide of a tetravalent metal element).

In the present specification, the "hydroxide of a tetravalent metal element" is a compound containing a tetravalent metal ($M^{4+}$) and at least one hydroxide ion ($OH^-$). The hydroxide of a tetravalent metal element may also contain an anion other than hydroxide ion (for example, nitrate ion $NO_3^-$ and sulfate ion $SO_4^{2-}$). For example, the hydroxide of a tetravalent metal element may also contain an anion bonded to a tetravalent metal element (for example, nitrate ion $NO_3^-$ and sulfate ion $SO_4^{2-}$).

Compared to abrasive grains composed of silica, ceria, and the like, the abrasive grains containing a hydroxide of a tetravalent metal element have high reactivity with an insulating material (for example, silicon oxide) and can polish an insulating material at a high polishing rate.

It is preferable that the hydroxide of a tetravalent metal element contains at least one selected from the group consisting of hydroxides of rare earth metal elements and hydroxide of zirconium. From the viewpoint that the polishing rate for an insulating material further increases, it is more preferable that the hydroxide of a tetravalent metal element is a hydroxide of a rare earth metal element. Examples of the rare earth metal element that can adopt tetravalence include lanthanoids such as cerium, praseodymium, and terbium, and among these, from the viewpoint that a polishing rate for an insulating material is further excellent, a lanthanoid is preferred and cerium is more preferred. A hydroxide of a rare earth metal element and hydroxide of zirconium may be used in combination, or two or more kinds from hydroxides of rare earth metal elements can be selected and used.

From the viewpoint that the polishing rate for an insulating material further increases, the lower limit of the content of the second particles is preferably 5% by mass or more, more preferably 8% by mass or more, even more preferably 10% by mass or more, particularly preferably 12% by mass or more, and extremely preferably 15% by mass or more, on the basis of the total amount of the first particles and the second particles. From the viewpoint that the polishing rate for an insulating material further increase, the upper limit of the content of the second particles is preferably 50% by mass or less, more preferably 40% by mass or less, even more preferably 30% by mass or less, and particularly preferably 20% by mass or less, on the basis of the total amount of the first particles and the second particles. From the above-described viewpoints, the content of the second particles is more preferably 5% to 50% by mass on the basis of the total amount of the first particles and the second particles.

From the viewpoint that the polishing rate for an insulating material further increases, the lower limit of the content of the second particles is preferably 0.005% by mass or more, more preferably 0.01% by mass or more, even more preferably 0.03% by mass or more, particularly preferably 0.05% by mass or more, and extremely preferably 0.1% by mass or more, on the basis of the total mass of the slurry. From the viewpoint that it becomes easy to avoid aggregation of the abrasive grains, and a satisfactory chemical interaction occurs between the abrasive grains and a surface to be polished so that the characteristics of the abrasive grains can be effectively utilized, the upper limit of the content of the second particles is preferably 5% by mass or less, more preferably 4% by mass or less, even more preferably 3% by mass or less, particularly preferably 2% by mass or less, extremely preferably 1% by mass or less, and highly preferably 0.5% by mass or less, on the basis of the total mass of the slurry. From the above-described viewpoints, the content of the second particles is more preferably 0.005% to 5% by mass on the basis of the total mass of the slurry.

From the viewpoint that a chemical interaction is enhanced between the abrasive grains and a surface to be polished so that the polishing rate for an insulating material further increases, the lower limit of the content of the hydroxide of a tetravalent metal element is preferably 0.005% by mass or more, more preferably 0.01% by mass or more, even more preferably 0.03% by mass or more, particularly preferably 0.05% by mass or more, and extremely preferably 0.1% by mass or more, on the basis of the total mass of the slurry. From the viewpoint that it becomes easy to avoid aggregation of the abrasive grains, and a satisfactory chemical interaction occurs between the abrasive grains and a surface to be polished so that the characteristics of the abrasive grains can be effectively utilized, the upper limit of the content of the hydroxide of a tetravalent metal element is preferably 5% by mass or less, more preferably 4% by mass or less, even more preferably 3% by mass or less, particularly preferably 2% by mass or less, extremely preferably 1% by mass or less, and highly preferably 0.5% by mass or less, on the basis of the total mass of the slurry. From the above-described viewpoints, the content of the hydroxide of a tetravalent metal element is more preferably 0.005% to 5% by mass on the basis of the total mass of the slurry.

From the viewpoint that the polishing rate for an insulating material further increases, the lower limit of the content of the abrasive grains is preferably 0.01% by mass or more, more preferably 0.03% by mass or more, even more preferably 0.05% by mass or more, particularly preferably 0.07% by mass or more, extremely preferably 0.1% by mass or more, highly preferably 0.15% by mass or more, still more preferably 0.3% by mass or more, and even more preferably 0.5% by mass or more, on the basis of the total mass of the slurry. From the viewpoint of enhancing the storage stability of the slurry, the upper limit of the content of the abrasive grains is preferably 10% by mass or less, more preferably 8% by mass or less, and even more preferably 6% by mass or less, on the basis of the total mass of the slurry. From the above-described viewpoints, the content of the abrasive grains is more preferably 0.01% to 10% by mass on the basis of the total mass of the slurry.

Furthermore, it is preferable that the content of the abrasive grains is further decreased from the viewpoint that the cost and polishing scratches can be further reduced. Generally, when the content of the abrasive grains becomes smaller, the polishing rate for an insulating material or the like also tends to decrease. On the other hand, since abrasive grains including particles that contain a hydroxide of a tetravalent metal element can provide a predetermined polishing rate even with a small amount, the content of the abrasive grains can be further reduced, while a balance is achieved between the polishing rate and the advantage of reducing the content of the abrasive grains. From these viewpoints, the upper limit of the content of the abrasive grains is preferably 5% by mass or less, more preferably 4% by mass or less, even more preferably 3% by mass or less, particularly preferably 2% by mass or less, and extremely preferably 1% by mass or less.

[Absorbance]

It is preferable that the second particles contain a hydroxide of a tetravalent metal element while satisfying at least one of the following conditions (a) and (b). An "aqueous dispersion liquid" having the content of the second particles adjusted to a predetermined amount means a liquid containing a predetermined amount of the second particles and water.

(a) The second particles provide an absorbance of 1.00 or higher for light having a wavelength of 400 nm in an aqueous dispersion liquid having the content of the second particles adjusted to 1.0% by mass.

(b) The second particles provide an absorbance of 1.000 or higher for light having a wavelength of 290 nm in an aqueous dispersion liquid having the content of the second particles adjusted to 0.0065% by mass.

With regard to the condition (a), by using particles that provide an absorbance of 1.00 or higher for light having a wavelength of 400 nm in an aqueous dispersion liquid having the content of the second particles adjusted to 1.0% by mass, the polishing rate can be further increased. The reasons for this are not necessarily clearly known; however, the present inventors speculate the reasons to be as follows. That is, it is considered that depending on the production conditions for the hydroxide of a tetravalent metal element, or the like, particles containing $M(OH)_a X_b$ (wherein a+b× c=4) composed of a tetravalent metal ($M^{4+}$), one to three hydroxide ions ($OH^-$), and one to three anions ($X^{c-}$) are produced (meanwhile, such particles are also "particles containing a hydroxide of a tetravalent metal element"). It is speculated that, in $M(OH)_a X_b$, an electron-withdrawing anion ($X^{c-}$) acts so that the reactivity of hydroxide ion is enhanced, and the polishing rate is increased along with an increase in the abundance of $M(OH)_a X_b$. Further, it is considered that, since particles containing $M(OH)_a X_b$ absorbs light having a wavelength of 400 nm, the polishing rate is increased along with an increase in the abundance of $M(OH)_a X_b$ for increasing the absorbance for light having a wavelength of 400 nm.

It is considered that particles containing a hydroxide of a tetravalent metal element can contain not only $M(OH)_a X_b$ but also $M(OH)_4$, $MO_2$, and the like. Examples of the anion ($X^{c-}$) include $NO_3^-$ and $SO_4^{2-}$.

Meanwhile, whether the particles containing a hydroxide of a tetravalent metal element contains $M(OH)_a X_b$ can be checked by a method of thoroughly washing the particles with pure water and then detecting peaks corresponding to the anion ($X^{c-}$) by FT-IR ATR method (Fourier Transform Infra Red Spectrometer Attenuated Total Reflection method). The presence of the anion ($X^{c-}$) can also be checked by XPS method (X-ray Photoelectron Spectroscopy).

Here, it has been confirmed that an absorption peak at a wavelength of 400 nm of $M(OH)_a X_b$ (for example, $M(OH)_3 X$) is much smaller than the below-mentioned absorption peak at a wavelength of 290 nm. In this regard, the present inventors conducted an investigation on the magnitude of the absorbance using an aqueous dispersion liquid having a content of 1.0% by mass, which has a relatively large content of particles and whose absorbance is likely to be detected to be high, and as a result, the present inventors found that, in the case of using particles having an absorbance of 1.00 or higher for light having a wavelength of 400 nm in the aqueous dispersion liquid, an effect of increasing the polishing rate is excellent.

The lower limit of the absorbance for light having a wavelength of 400 nm is preferably 1.50 or higher, more preferably 1.55 or higher, and even more preferably 1.60 or higher, from the viewpoint that it becomes easier to polish an insulating material at a further excellent polishing rate.

With regard to the condition (b), by using second particles having an absorbance of 1.000 or higher for light having a wavelength of 290 nm in an aqueous dispersion liquid having the content of the second particles adjusted to 0.0065% by mass, the polishing rate can be further increased. The reason for this is not clearly understood; however, the present inventors speculate the reason as follows. That is, particles containing $M(OH)_aX_b$ (for example, $M(OH)_3X$), that are produced depending on the production conditions for the hydroxide of a tetravalent metal element and the like, have an absorption peak near the wavelength of 290 nm according to calculations, and for example, particles composed of $Ce^{4+}(OH^-)_3NO_3^-$ have an absorption peak at the wavelength of 290 nm. Therefore, it is considered that, as the abundance of $M(OH)_aX_b$ increases and thereby the absorbance for light having a wavelength of 290 nm increases, the polishing rate is increased.

Here, the absorbance for light having a wavelength of about 290 nm tends to be detected to a greater degree as the measuring limit is exceeded. In this regard, the present inventors conducted an investigation on the magnitude of the absorbance using an aqueous dispersion liquid having a content of 0.0065% by mass, which has a relatively small content of particles and whose absorbance is easily detected to a small degree, and as a result, the present inventors found that the effect of increasing the polishing rate is excellent in the case of using particles that provide an absorbance of 1.000 or higher for light having a wavelength of 290 nm in the aqueous dispersion liquid.

From the viewpoint of polishing an insulating material at a further excellent polishing rate, the lower limit of the absorbance for light having a wavelength of 290 nm is more preferably 1.050 or higher, even more preferably 1.100 or higher, particularly preferably 1.130 or higher, and extremely preferably 1.150 or higher. The upper limit of the absorbance for light having a wavelength of 290 nm is not particularly limited; however, for example, it is preferably 10.00 or lower.

In a case in which the second particles, that provide an absorbance of 1.00 or higher for light having a wavelength of 400 nm, provide an absorbance of 1.000 or higher for light having a wavelength of 290 nm in an aqueous dispersion liquid having the content of the second particles adjusted to 0.0065% by mass, an insulating material can be polished at a further excellent polishing rate.

Furthermore, a hydroxide of a tetravalent metal element (for example, $M(OH)_aX_b$) tends not to absorb light having a wavelength of 450 nm or higher (particularly, a wavelength of 450 to 600 nm). Therefore, from the viewpoint of suppressing adverse influence on polishing as a result of containing impurities, and thereby polishing an insulating material at a further excellent polishing rate, it is preferable that the second particles provide an absorbance of 0.010 or lower for light having a wavelength of 450 to 600 nm in an aqueous dispersion liquid having the content of the second particles adjusted to 0.0065% by mass (65 ppm). That is, it is preferable that the absorbance for entire light in the wavelength range of 450 to 600 nm in an aqueous dispersion liquid having the content of the second particles adjusted to 0.0065% by mass does not exceed 0.010. The upper limit of the absorbance for light having a wavelength of 450 to 600 nm is more preferably lower than 0.010. The lower limit of the absorbance for light having a wavelength of 450 to 600 nm is preferably 0.

The absorbance in an aqueous dispersion liquid can be measured using, for example, a spectrophotometer (apparatus name: U3310) manufactured by Hitachi, Ltd. Specifically, for example, an aqueous dispersion liquid having the content of the second particles adjusted to 1.0% by mass or 0.0065% by mass is prepared as a measurement sample. About 4 mL of this measurement sample is introduced into a 1-cm square cell, and the cell is placed in the apparatus. Next, measurement of the absorbance is performed in the wavelength range of 200 to 600 nm, and the absorbance is determined from a chart thus obtained.

[Light Transmittance]

It is preferable that the second particles contained in the slurry of the present embodiment provide a light transmittance of 50%/cm or higher for light having a wavelength of 500 nm in an aqueous dispersion liquid having the content of the second particles adjusted to 1.0% by mass. Thereby, a decrease in the polishing rate due to the addition of an additive can be further suppressed, and therefore, it becomes easy to obtain other characteristics while maintaining the polishing rate. From this viewpoint, the lower limit of the light transmittance is more preferably 60%/cm or higher, even more preferably 70%/cm or higher, particularly preferably 80%/cm or higher, extremely preferably 90%/cm or higher, and highly preferably 92%/cm or higher. The upper limit of the light transmittance is 100%/cm.

The reason why it is possible to suppress a decrease in the polishing rate by adjusting the light transmittance of the particles like this is not understood in detail; however, the present inventors consider the reason as follows. It is considered that, in particles containing a hydroxide of a tetravalent metal element (cerium or the like), chemical action becomes predominant over mechanical action. Therefore, it is considered that the number of particles contributes to the polishing rate rather than the size of the particles.

In a case in which the light transmittance of an aqueous dispersion liquid having a content of the particles of 1.0% by mass is low, it is considered that the particles present in the aqueous dispersion liquid contain a relatively larger portion of particles having a large particle size (hereinafter, referred to as "coarse particles"). When an additive (for example, polyvinyl alcohol (PVA)) is added to a slurry containing such particles, as shown in FIG. 1, coarse particles serve as nuclei, and other particles aggregate around thereon. As a result, it is considered that, since the number of particles acting on the surface to be polished per unit area (effective number of particles) is reduced, and the specific surface area of the particles that are in contact with the surface to be polished is reduced, a decrease in the polishing rate is induced.

Figure 2:
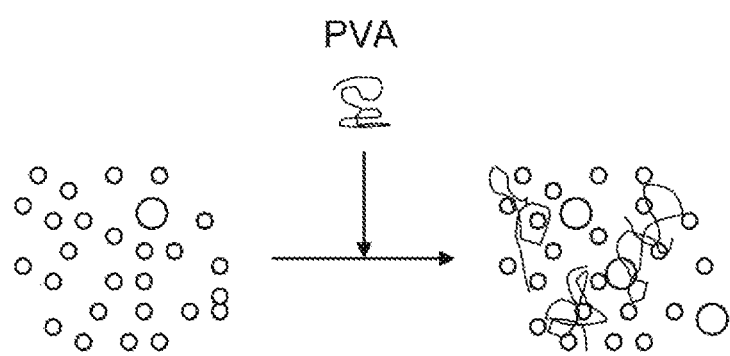
FIG. 2 is a schematic diagram illustrating the state in which abrasive grains aggregate when an additive is added.

On the other hand, in a case in which the light transmittance in an aqueous dispersion liquid having a content of particles of 1.0% by mass is high, it is considered that the particles present in the aqueous dispersion liquid are in a state in which there are few "coarse particles". In a case in which the abundance of coarse particles is small like this, as shown in FIG. 2, even if an additive (for example, polyvinyl alcohol) is added to the slurry, since there are few coarse particles that become the nuclei of aggregation, aggregation between particles is suppressed, or the size of the aggregated particles becomes smaller compared to the aggregated particles shown in FIG. 1. As a result, it is considered that, since the number of particles acting on the surface to be polished per unit area (effective number of particles) is maintained, and the specific surface area of the particles that are in contact with the surface to be polished is maintained, a decrease in the polishing rate does not easily occur.

According to the investigation of the present inventors, it can be seen that, even for slurries having the same particle size measured with a general particle size analyzer, there may be a slurry that is visually transparent (the light transmittance is high) and a slurry that is visually cloudy (the light transmittance is low). From this, it is considered that coarse particles that can cause such action as described above contribute to a decrease in the polishing rate even with a very small amount that is undetectable with a general particle size analyzer.

Furthermore, it can be seen that even if filtration is repeated several times in order to reduce coarse particles, the occurrence that the polishing rate is decreased by an additive is not much ameliorated, and the above-described effect of increasing the polishing rate due to the absorbance may not be sufficiently exhibited. Thus, the present inventors found that the above-described problems can be solved by devising the production method for particles or the like and using particles having a high light transmittance in an aqueous dispersion liquid.

The light transmittance is a transmittance for light having a wavelength of 500 nm. The light transmittance can be measured with a spectrophotometer. Specifically, for example, it can be measured with a spectrophotometer U3310 (apparatus name) manufactured by Hitachi, Ltd.

As a more specific measurement method, an aqueous dispersion liquid having the content of the second particles adjusted to 1.0% by mass is prepared as a measurement sample. About 4 mL of this measurement sample is introduced into a 1-cm square cell, the cell is placed in the apparatus, and then measurement is performed.

The absorbance and light transmittance that are provided in the aqueous dispersion liquid by the second particles contained in the slurry can be measured by removing solid components other than the second particles and liquid components other than water, subsequently preparing an aqueous dispersion liquid having a predetermined content, and performing measurement using this aqueous dispersion liquid. It may vary depending on the components contained in the slurry; however, for the removal of solid components or liquid components, for example, a centrifugation method such as centrifugation using a centrifuge that can apply a gravitational acceleration of several thousand G or less, or super-centrifugation using a super-centrifuge that can apply a gravitational acceleration of several ten thousand G or greater; a chromatographic method such as partition chromatography, adsorption chromatography, gel permeation chromatography, or ion exchange chromatography; a filtration method such as natural filtration, filtration under reduced pressure, pressure filtration, or ultrafiltration; and a distillation method such as reduced pressure distillation or normal pressure distillation, can be used, and these may also be used in combination as appropriate.

For example, in a case in which a compound having a weight average molecular weight of several ten thousands or more (for example, 50000 or more) is contained, examples of a separation method for the second particles include a chromatographic method and a filtration method, and among these, at least one selected from the group consisting of gel permeation chromatography and ultrafiltration is preferred. In the case of using a filtration method, the particles contained in the slurry can be passed through a filter by setting appropriate conditions. In a case in which a compound having a weight average molecular weight of several ten thousands or less (for example, less than 50000) is contained, examples of the separation method for the second particles include a chromatographic method, a filtration method, and a distillation method, and at least one selected from the group consisting of gel permeation chromatography, ultrafiltration, and distillation under reduced pressure is preferred. In a case in which a plurality of kinds of particles is contained, examples of the separation method for the second particles include a filtration method and a centrifugation method, and more particles containing a hydroxide of a tetravalent metal element are contained in the filtrate in the case of filtration, while more particles are contained in the liquid phase in the case of centrifugation.

As a method of separating solid components other than the second particles, for example, it is possible to separate under the following conditions for centrifugation.

Centrifuge: Optima MAX-TL (manufactured by Beckman Coulter, Inc.)
Centrifugation acceleration: 40000 G
Treatment time: 5 minutes
Treatment temperature: 25° C.

As a method of separating the second particles by a chromatographic method, for example, it is possible to isolate the second particles and/or other components under the following conditions.

Sample solution: 100 μL of slurry
Detector: Manufactured by Hitachi, Ltd., UV-VIS detector, trade name "L-4200"
Wavelength: 400 nm
Integrator: Manufactured by Hitachi, Ltd., GPC integrator, trade name "D-2500"
Pump: Manufactured by Hitachi, Ltd., trade name "L-7100"
Column: Manufactured by Hitachi Chemical Co., Ltd., water-based packed column for HPLC, trade name "GL-W550S"
Eluent: Deionized water
Measurement temperature: 23° C.
Flow rate: 1 mL/min (pressure is about 40 to 50 kg/cm$^2$)
Measurement time: 60 minutes Depending on the components contained in the slurry, there is a possibility that the second particles may not be isolated even under the above-described conditions; however, in that case, it is possible to separate by optimizing the amount of the sample solution, the type of column, the type of eluent, the measurement temperature, the flow rate, and the like. Furthermore, there is a possibility that it is possible to separate from the second particles by adjusting the pH of the slurry to adjust the distillation time for the components contained in the slurry. In a case in which there are insoluble components in the slurry, it is preferable to remove the insoluble components by filtration, centrifugation, and the like, according to necessity.

[Method for Producing Second Particles]

A hydroxide of a tetravalent metal element can be produced by reacting a salt of a tetravalent metal element (metal salt) with an alkali source (base). It is preferable that the hydroxide of a tetravalent metal element is produced by mixing a salt of a tetravalent metal element with an alkali solution (for example, an aqueous alkali solution). Thereby, particles having a very fine particle size can be obtained, and a slurry having a further excellent effect of reducing polishing scratching can be obtained. Such a technique is disclosed in, for example, Patent Literatures 6 and 7. A hydroxide of a tetravalent metal element can be obtained by mixing a metal salt solution of a salt of a tetravalent metal element (for example, an aqueous solution of a metal salt) with an alkali solution. Regarding the salt of a tetravalent metal element, conventionally known salts can be used without any particular limitations, and examples include $M(NO_3)_4$, $M(SO_4)_2$, $M(NH_4)_2(NO_3)_6$, $M(NH_4)_4(SO_4)_4$ (wherein M represents a rare earth metal element), and $Zr(SO_4)_2 \cdot 4H_2O$. Cerium (Ce) which is chemically active is preferable for M.

(Optional Components)

The slurry of the present embodiment may further contain optional additives for the purpose of adjusting the polishing characteristics, and the like. Examples of the optional additives include a material having a carboxyl group (excluding a compound corresponding to a polyoxyalkylene compound or a water-soluble polymer), a polyoxyalkylene compound, a water-soluble polymer, and an oxidizing agent (for example, hydrogen peroxide). The respective additives can be used singly or in combination of two or more kinds thereof.

Optional additives (a water-soluble polymer and the like) have an effect by which the dispersion stability of the abrasive grains in the slurry can be increased, and an insulating material (for example, silicon oxide) can be polished at a higher rate. Furthermore, since an insulating material (for example, silicon oxide) can be polished at high rate, the level difference elimination property is enhanced, and high flattening properties can also be obtained. This is considered to be because the polishing rate for convexities is increased to a large extent compared to concavities.

Examples of the material having a carboxyl group include monocarboxylic acids such as acetic acid, propionic acid, butyric acid, and valeric acid; hydroxy acids such as lactic acid, malic acid, and citric acid; dicarboxylic acids such as malonic acid, succinic acid, fumaric acid, and maleic acid; polycarboxylic acids such as polyacrylic acid and polymaleic acid; and amino acids such as arginine, histidine, and lysine.

From the viewpoint that an insulating material easily exhibit a high polishing rate, the upper limit of the weight average molecular weight of the material having a carboxyl group is preferably 100000 or less, more preferably 80000 or less, even more preferably 60000 or less, particularly preferably 50000 or less, and extremely preferably 10000 or less. From the viewpoint that appropriate dispersibility can be maintained, the lower limit of the weight average molecular weight of the material having a carboxyl group is preferably 1000 or more, more preferably 1500 or more, even more preferably 2000 or more, and particularly preferably 5000 or more.

The content of the material having a carboxyl group is preferably 0.01% to 10% by mass on the basis of the total mass of the slurry. Thereby, an insulating material is easily polished at a high polishing rate while aggregation between abrasive grains is suppressed.

Examples of the polyoxyalkylene compound include a polyalkylene glycol and a polyoxyalkylene derivative.

Examples of the polyalkylene glycol include polyethylene glycol, polypropylene glycol, and polybutylene glycol. The polyalkylene glycol is preferably at least one selected from the group consisting of polyethylene glycol and polypropylene glycol, and is more preferably polyethylene glycol.

A polyoxyalkylene derivative is, for example, a compound obtained by introducing a functional group or a substituent to a polyalkylene glycol, or a compound obtained by adding a polyalkylene oxide to an organic compound. Examples of the functional group or a substituent include an alkyl ether group, an alkyl phenyl ether group, a phenyl ether group, a styrenated phenyl ether group, a glyceryl ether group, an alkylamine group, a fatty acid ester group, and a glycol ester group. Examples of the polyoxyalkylene derivative include a polyoxyethylene alkyl ether, polyoxyethylene bisphenol ether (for example, manufactured by NIPPON NYUKAZAI CO., LTD., BA GLYCOL series), polyoxyethylene styrenated phenyl ether (for example, manufactured by Kao Corporation, EMULGEN series), a polyoxyethylene alkyl phenyl ether (for example, manufactured by DKS Co. Ltd., NOIGEN EA series), a polyoxyalkylene polyglyceryl ether (for example, manufactured by Sakamoto Yakuhin Kogyo Co., Ltd., SC-E series and SC-P series), a polyoxyethylene sorbitan fatty acid ester (for example, manufactured by DKS Co. Ltd., SORGEN TW series), a polyoxyethylene fatty acid ester (for example, manufactured by Kao Corporation, EMANON series), a polyoxyethylene alkylamine (for example, manufactured by DKS Co. Ltd., AMIRADIN D), and other compounds having a polyalkylene oxide added thereto (for example, manufactured by Nissin Chemical Co., Ltd., SURFINOL 465, and manufactured by NIPPON NYUKAZAI CO., LTD., TMP series).

The upper limit of the weight average molecular weight of the polyoxyalkylene compound is not particularly limited; however, from the viewpoint that appropriate workability and foamability are easily obtainable, the upper limit is preferably 100000 or less, more preferably 50000 or less, even more preferably 20000 or less, particularly preferably 10000 or less, and extremely preferably 5000 or less. From the viewpoint that flattening properties are further enhanced, the lower limit of the weight average molecular weight of the polyoxyalkylene compound is preferably 200 or more, more preferably 400 or more, and even more preferably 500 or more.

From the viewpoint that flattening properties are further enhanced, the lower limit of the content of the polyoxyalkylene compound is preferably 0.01% by mass or more, more preferably 0.02% by mass or more, even more preferably 0.1% by mass or more, and particularly preferably 0.2% by mass or more, on the basis of the total mass of the slurry. From the viewpoint that it is easy to obtain an adequate polishing rate, the upper limit of the content of the polyoxyalkylene compound is preferably 5% by mass or less, more preferably 2% by mass or less, and even more preferably 1% by mass or less, on the basis of the total mass of the slurry.

A water-soluble polymer has an effect of adjusting the polishing characteristics such as the dispersion stability of the abrasive grains, flattening properties, in-plane uniformity, polishing selectivity for silicon oxide with respect to silicon nitride (polishing rate for silicon oxide/polishing rate for silicon nitride), and polishing selectivity for silicon oxide with respect to polysilicon (polishing rate for silicon oxide/polishing rate for polysilicon). Here, the "water-soluble polymer" is defined as a polymer that dissolves in an amount of 0.1 g or more in 100 g of water. Meanwhile, a polymer that corresponds to the polyoxyalkylene compound is not to be included in the "water-soluble polymer".

The water-soluble polymer is not particularly limited, and examples include acrylic polymers such as polyacrylamide and polydimethylacrylamide; polysaccharides such as carboxymethyl cellulose, agar, curdlan, dextrin, cyclodextrin, and pullulan; vinyl-based polymers such as polyvinyl alcohol, polyvinylpyrrolidone, and polyacrolein; glycerin-based polymers such as polyglycerin and a polyglycerin derivative; and polyethylene glycol. The water-soluble polymers can be used singly or in combination of two or more kinds thereof.

In the case of using a water-soluble polymer, from the viewpoint that an effect of adding a water-soluble polymer is obtained while sedimentation of the abrasive grains is suppressed, the lower limit of the content of the water-soluble polymer is preferably 0.001% by mass or more, more preferably 0.01% by mass or more, even more preferably 0.1% by mass or more, particularly preferably 0.3% by mass or more, and extremely preferably 0.5% by mass or more, on the basis of the total mass of the slurry. From the viewpoint that an effect of adding a water-soluble polymer is obtained while sedimentation of the abrasive grains is suppressed, the upper limit of the content of the water-soluble polymer is preferably 10% by mass or less, more preferably 8% by mass or less, even more preferably 6% by mass or less, particularly preferably 5% by mass or less, extremely preferably 3% by mass or less, and highly preferably 1% by mass or less, on the basis of the total mass of the slurry. In a case in which a plurality of compounds is used as the water-soluble polymer, it is preferable that the sum of the respective contents of the compounds satisfies the above-described range.

In the case of using an oxidizing agent, the content of the oxidizing agent is preferably 0.0001% to 10% by mass on the basis of the total mass of the slurry, from the viewpoint that the effect of adding an additive is obtained while sedimentation of the abrasive grains is suppressed.

(Liquid Medium)

The liquid medium for the slurry of the present embodiment is not particularly limited; however, water such as deionized water or ultrapure water is preferred. The content of the liquid medium may be the balance of the slurry remaining after excluding the contents of other constituent components, and the content is not particularly limited.

(Characteristics of Slurry)

From the viewpoint that the polishing rate for an insulating material is further increased, the lower limit of pH of the slurry of the present embodiment is preferably 2.0 or higher, more preferably 2.5 or higher, even more preferably 2.8 or higher, particularly preferably 3.0 or higher, extremely preferably 3.2 or higher, and highly preferably 3.5 or higher. From the viewpoint that the storage stability of the slurry is further enhanced, the upper limit of pH is preferably 7.0 or lower, more preferably 6.5 or lower, even more preferably 6.0 or lower, particularly preferably 5.0 or lower, and extremely preferably 4.0 or lower. From the above-described viewpoints, the pH is more preferably 2.0 to 7.0. The pH of the slurry is defined as the pH at a liquid temperature of 25° C.

The pH of the slurry can be adjusted by means of an acid component such as an inorganic acid or an organic acid; an alkali component such as ammonia, sodium hydroxide, tetramethylammonium hydroxide (TMAH), imidazole, or an alkanolamine; or the like. Furthermore, a buffering agent may also be added in order to stabilize the pH. A buffering agent may be added as a buffer solution (a liquid containing a buffering agent). Examples of such a buffer solution include an acetate buffer solution and a phthalate buffer solution.

The pH of the slurry of the present embodiment can be measured with a pH meter (for example, Product No. PHL-40 manufactured by DKK Corp.). Specifically, for example, a pH meter is subjected to two-point calibration using a phthalate pH buffer solution (pH: 4.01) and a neutral phosphate pH buffer solution (pH: 6.86) as standard buffer solutions, subsequently the electrode of the pH meter is introduced into the slurry, and the value after being stabilized after a lapse of two minutes or longer is measured. The liquid temperatures of the standard buffer solutions and the slurry are all set to 25° C.

In a case in which the slurry of the present embodiment is used as a CMP polishing liquid, the constituent components of the polishing liquid may be stored as a one-pack polishing liquid, or may be stored as a multi-pack (for example, two-pack) polishing liquid set in which the constituent components of the polishing liquid are divided into a slurry and an additive liquid such that a slurry (first liquid) containing abrasive grains and a liquid medium and an additive liquid (second liquid) containing additives and a liquid medium are mixed to form the above-described polishing liquid. The additive liquid may contain, for example, an oxidizing agent. The constituent components of the polishing liquid may also be stored as a polishing liquid set divided into three or more liquids.

With regard to the polishing liquid set described above, the slurry and the additive liquid are mixed immediately before polishing or during polishing, and thus a polishing liquid is produced. Furthermore, the one-pack polishing liquid may be stored as a stock solution for polishing liquid, in which the content of the liquid medium has been reduced, and may be used after being diluted with the liquid medium during polishing. The multi-pack polishing liquid set may be stored as a stock solution for slurry and a stock solution for additive liquid, in both of which the content of the liquid medium has been reduced, and may be used after being diluted with the liquid during polishing.

In the case of the one-pack polishing liquid, as a method of supplying the polishing liquid onto a polishing platen, a method of directly conveying a polishing liquid for supply; a method of conveying a stock solution for polishing liquid and a liquid medium through separate piping, joining and mixing these for supply; a method of mixing a stock solution for polishing liquid and a liquid medium in advance for supply; and the like can be used.

In a case in which it is stored as a multi-pack polishing liquid set divided into a slurry and an additive liquid, the polishing rate can be adjusted by arbitrarily changing the composition of these liquids. In a case in which polishing is performed using the polishing liquid set, the following method may be used as a method for supplying the polishing liquid onto a polishing platen. For example, a method of conveying a slurry and an additive liquid through separate pipings, joining these pipings to mix for supply; a method of conveying a stock solution for slurry, a stock solution for additive liquid, and a liquid medium through separate pipings, joining and mixing these for supply; a method of mixing a slurry and an additive liquid in advance for supply; a method of mixing a stock solution for slurry, a stock solution for additive liquid, and a liquid medium in advance for supply; and the like can be used. Furthermore, a method of supplying a slurry and an additive liquid of the above-described polishing liquid set separately onto the polishing platen can also be used. In this case, a surface to be polished is polished using a polishing liquid that is obtained by mixing the slurry and the additive liquid on the polishing platen.

<Polishing Method>

A polishing method (a polishing method for a base substrate or the like) of the present embodiment includes a polishing step of polishing a surface to be polished (a surface to be polished of a base substrate, or the like) using the above-described slurry. The slurry used in the polishing step may be a polishing liquid obtainable by mixing a slurry and an additive liquid of the above-described polishing liquid set.

In the polishing step, for example, in a state in which a material to be polished of a base substrate having the material to be polished is pressed against a polishing pad (polishing cloth) of a polishing platen, the above-described slurry is supplied between the material to be polished and the polishing pad, and a surface to be polished of the material to be polished is polished by moving the base substrate and the polishing platen relatively to each other. In the polishing step, for example, at least a portion of the material to be polished is removed by polishing.

Regarding the base substrate as an object to be polished, a substrate to be polished or the like may be mentioned. An example of the substrate to be polished may be a base substrate in which a material to be polished is formed on a substrate related to the semiconductor element production (for example, a semiconductor substrate having an STI pattern, a gate pattern, a wiring pattern, or the like formed thereon). Examples of the material to be polished include insulating materials such as silicon oxide. The material to be polished may be a single material, or may be a plurality of materials. In a case in which a plurality of materials is exposed on the surface to be polished, those materials can be considered as the materials to be polished. The material to be polished may be in a film form (film to be polished), and it may be an insulating film such as a silicon oxide film.

By polishing the material to be polished (for example, an insulating material such as silicon oxide) formed on such a substrate with the slurry to remove unwanted portions, unevenness of the surface of the material to be polished is eliminated, and thus a smooth surface can be obtained over the entire surface of the polished material. It is preferable that the slurry of the present embodiment is used to polish a surface to be polished containing silicon oxide.

Examples of a method for producing a material to be polished that is to be polished by the slurry of the present embodiment include CVD methods such as a low-pressure CVD method, a quasi-normal pressure CVD method, and a plasma CVD method; and a spin coating method of applying a liquid raw material on a rotating substrate.

In the following description, the polishing method of the present embodiment will be described by taking a polishing method for a base substrate (for example, a base substrate having an insulating material formed on a semiconductor substrate) as an example. In the polishing method of the present embodiment, as a polishing apparatus, a general polishing apparatus having a holder that is capable of retaining a base substrate having a surface to be polished; and a polishing platen to which a polishing pad can be attached, can be used. The holder and the polishing platen are respectively equipped with a motor capable of changing a rotation number, or the like. As the polishing apparatus, for example, polishing apparatus: F-REX300 manufactured by EBARA CORPORATION, or polishing apparatus: Reflexion manufactured by Applied Materials, Inc. can be used.

As the polishing pad, a general nonwoven fabric, a foamed body, a non-foamed body, and the like can be used. As the material for the polishing pad, resins such as a polyurethane, an acrylic resin, a polyester, an acryl-ester copolymer, polytetrafluoroethylene, polypropylene, polyethylene, poly-4-methylpentene, cellulose, a cellulose ester, a polyamide (for example, NYLON (trade name) and aramid), a polyimide, a polyimideamide, a polysiloxane copolymer, an oxirane compound, a phenolic resin, polystyrene, a polycarbonate, and an epoxy resin, can be used. Particularly, from the viewpoint of obtaining further excellent polishing rate and flatness, the material for the polishing pad is preferably at least one selected from the group consisting of a foamed polyurethane and a non-foamed polyurethane. It is preferable that the polishing pad is subjected to groove processing, by which the slurry accumulates thereon.

There are no limitations on the polishing conditions; however, the upper limit of the rotation speed of the polishing platen is preferably 200 min$^{-1}$ or less so that the base substrate does not fly away, and the upper limit of the polishing pressure (processing load) applied to the base substrate is preferably 100 kPa or less, from the viewpoint of sufficiently suppressing the occurrence of polishing scratching. During polishing, it is preferable to supply the slurry continuously to the polishing pad using a pump or the like. There are no limitations on the supply amount for this, however, it is preferable that the surface of the polishing pad is always covered with the slurry.

It is preferable that the base substrate after the completion of polishing is thoroughly washed under flowing water, and thereby particles adhering to the base substrate are removed. For the washing, in addition to pure water, dilute hydrofluoric acid or aqueous ammonia may be used in combination therewith, and a brush may be used in combination in order to increase the washing efficiency. Furthermore, after washing, it is preferable that water droplets adhering to the base substrate are dropped by using a spin dryer or the like, and then the base substrate is dried.

The slurry and the polishing method of the present embodiment can be suitably used for the formation of STI and high-rate polishing of an interlayer insulating film. The lower limit of the polishing rate for an insulating material (for example, silicon oxide) is preferably 500 nm/min or higher, more preferably 800 nm/min or higher, even more preferably 1000 nm/min or higher, particularly preferably 1100 nm/min or higher, and extremely preferably 1200 nm/min or higher.

The slurry and the polishing method of the present embodiment can also be used for the polishing of a pre-metal insulating material. As the pre-metal insulating material, in addition to silicon oxide, for example, phosphorus-silicate glass or boron-phosphorus-silicate glass is used, and silicon oxyfluoride, amorphous carbon fluoride, and the like can also be used.

The slurry and the polishing method of the present embodiment can also be applied to materials other than the insulating materials such as silicon oxide. Examples of such a material include high-dielectric constant materials such as Hf-based, Ti-based, and Ta-based oxides; semiconductor materials such as silicon, amorphous silicon, SiC, SiGe, Ge, GaN, GaP, GaAs, and organic semiconductors; phase change materials such as GeSbTe; inorganic conductive materials such as ITO; and polymer resin materials such as polyimide-based, polybenzoxazole-based, acrylic, epoxy-based, and phenolic resin materials.

The slurry and the polishing method of the present embodiment can be applied not only to film-like objects to be polished, but also various substrates formed from glass, silicon, SiC, SiGe, Ge, GaN, GaP, GaAs, sapphire, plastics, and the like.

The slurry and the polishing method of the present embodiment can be used not only for the production of semiconductor elements, but also for the production of image display devices such as TFT and organic EL; optical components such as a photomask, a lens, a prism, an optical fiber, a single crystal scintillator; optical elements such as an optical switching element and an optical waveguide; light-emitting elements such as a solid laser and a blue laser LED; and magnetic storage devices such as a magnetic disc and a magnetic head.

According to the present embodiment, it is possible to provide a method for producing abrasive grains, wherein the method includes a step of bringing first particles, containing ceria and also having a negative zeta potential, into contact with second particles containing a hydroxide of a tetravalent metal element and also having a positive zeta potential. According to the present embodiment, it is possible to provide a method for producing a shiny, wherein the method includes a step of obtaining abrasive grains by the method for producing abrasive grains as described above.

EXAMPLES

Hereinafter, the present invention will be specifically described based on Examples; however, the present invention is not intended to be limited to these. Meanwhile, the pH was measured using Product No. PHL-40 manufactured by DKK Corp.

<Preparation of Cerium Oxide Slurry>

Particles containing cerium oxide (first particles; hereinafter, referred to as "cerium oxide particles") and trade name: POLYACRYLIC ACID 5000 (weight average molecular weight: 5000) manufactured by Wako Pure Chemical Industries, Ltd. were mixed, and thereby a cerium oxide slurry (pH: 5.0) containing 5.0% by mass (solid content) of cerium oxide particles was prepared. The blending amount of the polyacrylic acid was adjusted such that the content of the polyacrylic acid in the below-mentioned CMP polishing liquid would be the content indicated in Table 1.

An adequate amount of the cerium oxide slurry was introduced into trade name: MICROTRAC MT3300EXII manufactured by MicrotracBEL Corp., and measurement of the average particle size of the cerium oxide particles was performed. The displayed average particle size value was obtained as the average particle size (average secondary particle size). The average particle size in the cerium oxide slurry was 340 nm.

[Measurement of Zeta Potential]

An adequate amount of the cerium oxide slurry was introduced into trade name: DelsaNano C manufactured by Beckman Coulter, Inc., and measurement at 25° C. was performed twice. The average value of the displayed zeta potential was obtained as the zeta potential. The zeta potential of the cerium oxide particles in the cerium oxide slurry was −55 mV.

<Preparation of Cerium Hydroxide Slurry>

(Synthesis of Hydroxide of Tetravalent Metal Element)

350 g of a 50 mass % aqueous solution of $Ce(NH_4)_2(NO_3)_6$ (manufactured by NIHON KAGAKU SANGYO CO., LTD., trade name: CAN50 liquid) was mixed with 7825 g of pure water, and thereby a solution was obtained. Next, while this solution was stirred, 750 g of an aqueous solution of imidazole (10 mass % aqueous solution, 1.47 mol/L) was added dropwise thereto at a mixing rate of 5 mL/min, and thereby a precipitate containing cerium hydroxide was obtained. The synthesis of cerium hydroxide was performed at a temperature of 25° C. at a stirring speed of 400 $min^{-1}$. Stirring was performed using a three-blade pitch paddle having a total blade length of 5 cm.

The precipitate (precipitate containing cerium hydroxide) thus obtained was centrifuged (4000 $min^{-1}$, for 5 minutes), subsequently the liquid phase was removed by decantation, and thereby the precipitate was subjected to solid-liquid separation. 10 g of the particles obtained by solid-liquid separation were mixed with 990 g of water, and then the particles were dispersed in water using an ultrasonic cleaner, thereby, a cerium hydroxide slurry (particle content: 1.0 mass %) containing particles that contained cerium hydroxide (second particles; hereinafter, referred to as "cerium hydroxide particles") was prepared.

(Measurement of Average Particle Size)

The average particle size (average secondary particle size) of the cerium hydroxide particles in the cerium hydroxide slurry was measured using trade name: N5 manufactured by Beckman Coulter, Inc., and the average particle size was 25 nm. The measurement method is as follows. First, about 1 mL of a measurement sample (cerium hydroxide slurry, aqueous dispersion liquid) containing 1.0 mass % of cerium hydroxide particles was introduced into a 1-cm square cell, and the cell was placed in N5. As the measurement sample information of the N5 software, the refractive index was set to 1.333 and the viscosity was set to 0.887 mPa·s, and measurement was performed at 25° C., and then, the value displayed as Unimodal Size Mean was read out.

(Measurement of Zeta Potential)

An adequate amount of a cerium hydroxide slurry was introduced into trade name: DelsaNano manufactured by Beckman Coulter, Inc., and measurement was performed twice at 25° C. The average value of the displayed zeta potentials was obtained as the zeta potential. The zeta potential of the cerium hydroxide particles in the cerium hydroxide slurry was +50 mV.

(Structural Analysis of Cerium Hydroxide Particles)

An adequate amount of a cerium hydroxide slurry was collected and dried in a vacuum, and thereby cerium hydroxide particles were isolated. Subsequently, the particles were sufficiently washed with pure water, and thereby a sample was obtained. For the sample thus obtained, measurement was performed according to an FT-IR ATR method, and a peak based on nitrate ion ($NO_3^-$) was observed in addition to a peak based on hydroxide ion ($OH^-$). Furthermore, for the same sample, XPS (N-XPS) measurement for nitrogen was performed, and a peak based on $NH_4^+$ was not observed, while a peak based on nitrate ion was observed. From these results, it was verified that cerium hydroxide particles contained, at least in a portion, particles having nitrate ion bonded to cerium element. Furthermore, since particles having hydroxide ion bonded to cerium element were contained at least in a portion of the cerium hydroxide particles, it was verified that cerium hydroxide particles contained cerium hydroxide. From these results, it was verified that hydroxide of cerium contained hydroxide ion bonded to cerium element.

(Measurement of Absorbance and Light Transmittance)

An adequate amount of a cerium hydroxide slurry was collected and diluted with water such that the content of particles would be 0.0065% by mass (65 ppm), and thus, a measurement sample (aqueous dispersion liquid) was obtained. About 4 mL of this measurement sample was introduced into a 1-cm square cell, and the cell was placed in a spectrophotometer (apparatus name: U3310) manufactured by Hitachi, Ltd. Measurement of the absorbance in a wavelength range of 200 to 600 nm was performed, and the absorbance for light having a wavelength of 290 nm and the absorbance for a light having a wavelength of 450 to 600 nm were measured. The absorbance for light having a wavelength of 290 nm was 1.192, and the absorbance for light having a wavelength of 450 to 600 nm was less than 0.010.

About 4 mL of a cerium hydroxide slurry (content of particles: 1.0% by mass) was introduced into a 1-cm square cell, and the cell was placed in a spectrophotometer (apparatus name: U3310) manufactured by Hitachi, Ltd. Measurement of the absorbance in a wavelength range of 200 to 600 nm was performed, and the absorbance for light having a wavelength of 400 nm and the light transmittance for light having a wavelength of 500 nm were measured. The absorbance for light having a wavelength of 400 nm was 2.25, and the light transmittance for light having a wavelength of 500 nm was 92%/cm.

<Preparation of CMP Polishing Liquid>

Example 1

While stirring was performed at a rotation number of 500 rpm using a two-blade stirring blade, 600 g of the aforementioned cerium oxide slurry, 600 g of the aforementioned cerium hydroxide slurry, and 800 g of ion-exchanged water were mixed for 30 minutes, and thereby mixed liquid 1 was prepared. 300 g of the mixed liquid 1 and 600 g of ion-exchanged water were mixed, and thereby a CMP polishing liquid containing composite particles including cerium oxide particles and cerium hydroxide particles that were in contact with the cerium oxide particles (content of cerium oxide particles having a negative zeta potential: 0.5% by mass, content of cerium hydroxide particles having a positive zeta potential: 0.1% by mass, pH: 4.0) was prepared.

Example 2

To the mixed liquid 1 of Example 1, 15 g of polyethylene glycol PEG600 (weight average molecular weight: 600) manufactured by Wako Pure Chemical Industries, Ltd. was added, and thereby mixed liquid 2A was prepared. 300 g of the mixed liquid 2A and 600 g of ion-exchanged water were mixed, and thereby a CMP polishing liquid (content of cerium oxide particles having a negative zeta potential: 0.5% by mass, content of cerium hydroxide particles having a positive zeta potential: 0.1% by mass, pH: 4.0) was prepared.

Example 3

To the mixed liquid 1 of Example 1, 15 g of polyethylene glycol PEG4000 (weight average molecular weight: 4000) manufactured by Wako Pure Chemical Industries, Ltd. was added, and thereby mixed liquid 2B was prepared. 300 g of the mixed liquid 2B and 600 g of ion-exchanged water were mixed, and thereby a CMP polishing liquid (content of cerium oxide particles having a negative zeta potential: 0.5% by mass, content of cerium hydroxide particles having a positive zeta potential: 0.1% by mass, pH: 4.0) was prepared.

Example 4

To the mixed liquid 1 of Example 1, 15 g of PGL #750 (polyglycerin (water-soluble polymer), weight average molecular weight: 750) manufactured by Sakamoto Yakuhin Kogyo Co., Ltd. was added, and thereby mixed liquid 2C was prepared. 300 g of the mixed liquid 2C and 600 g of ion-exchanged water were mixed, and thereby a CMP polishing liquid (content of cerium oxide particles having a negative zeta potential: 0.5% by mass, content of cerium hydroxide particles having a positive zeta potential: 0.1% by mass, pH: 4.0) was prepared.

Comparative Example 1

100 g of a cerium oxide slurry and 900 g of ion-exchanged water were mixed, and thereby a CMP polishing liquid (content of cerium oxide particles having a negative zeta potential: 0.5% by mass, pH: 4.0) was prepared.

Comparative Example 2

100 g of a cerium hydroxide slurry and 900 g of ion-exchanged water were mixed, and thereby a CMP polishing liquid (content of cerium hydroxide particles having a positive zeta potential: 0.1% by mass, pH: 4.0) was prepared.

<Average Particle Size of Abrasive Grains>

Each of the CMP polishing liquids of Examples 1 to 4 and Comparative Example 1 was introduced in an adequate amount into trade name: MICROTRAC MT3300EXII manufactured by MicrotracBEL Corp., and measurement of the average particle size of the abrasive grains was performed. The displayed average particle size value was obtained as the average particle size (average secondary particle size). The measurement results are presented in Table 1. The average particle size of Examples 1 to 4 and Comparative Example 1 was 340 to 342 nm.

The average particle size (average secondary particle size) of the abrasive grains (cerium hydroxide particles) in the CMP polishing liquid of Comparative Example 2 was measured using trade name: N5 manufactured by Beckman Coulter, Inc. The average particle size of Comparative Example 2 was 25 mm <Zeta Potential of Abrasive Grains>

An adequate amount of the CMP polishing liquid was introduced into trade name: DelsaNano C manufactured by Beckman Coulter, Inc. Measurement was performed twice at 25° C., and the average value of the displayed zeta potentials was employed. The measurement results are presented in Table 1. The zeta potential of the abrasive grains of Examples 1 to 4 and Comparative Example 2 was 50 to 55 mV, and the zeta potential of Comparative Example 1 was −62 mV.

<CMP Evaluation>

A substrate to be polished was polished using the aforementioned CMP polishing liquid under the following polishing conditions.

[CMP Polishing Conditions]

Polishing apparatus: F-REX300 (manufactured by EBARA CORPORATION)

Flow rate of CMP polishing liquid: 250 mL/min

Substrate to be polished: As a blanket wafer having no pattern formed thereon, a substrate to be polished having a silicon oxide film having a thickness of 2 μm, which had been formed by a plasma CVD method, on a silicon substrate was used.

Polishing pad: Foamed polyurethane resin having closed pores (manufactured by Rohm and Haas Japan K.K., Product No.: IC1010)

Polishing pressure: 30 kPa (4.2 psi)

Rotation numbers of substrate to be polished and polishing platen: Substrate to be polished/polishing platen=93/87 rpm Polishing time: 0.5 minutes (30 seconds)

Washing of wafer: After a CMP treatment, washing was performed with water while applying an ultrasonic wave, and then drying was performed with a spin dryer.

The polishing rate ($SiO_2RR$) of a silicon oxide film that had been polished and washed under the conditions described above was determined by the formula below. Meanwhile, the film thickness difference of the silicon oxide film before and after polishing was determined using a light interference type film thickness measuring apparatus (manufactured by Filmetrics Japan, Inc., trade name: F80). The measurement results are presented in Table 1.

Polishing rate ($RR$)=(Film thickness difference [nm]
of silicon oxide film before and after polishing)/
(polishing time: 0.5 [min])

TABLE 1

| | Item | Example 1 | Example 2 | Example 3 | Example 4 | Comparative Example 1 | Comparative Example 2 |
|---|---|---|---|---|---|---|---|
| Abrasive grain | Content of cerium oxide particles (mass %) | 0.5 | 0.5 | 0.5 | 0.5 | 0.5 | — |
| | Content of cerium hydroxide particles (mass %) | 0.1 | 0.1 | 0.1 | 0.1 | — | 0.1 |
| Additive 1 | Type | Polyacrylic acid | Polyacrylic acid | Polyacrylic acid | Polyacrylic acid | — | — |
| | Content (mass %) | 0.01 | 0.01 | 0.01 | 0.01 | — | — |
| Additive 2 | Type | — | PEG600 | PEG4000 | PGL#750 | — | — |
| | Content (mass %) | — | 0.5 | 0.5 | 0.5 | — | — |
| Physical properties of CMP polishing liquid | pH of CMP polishing liquid | 4.0 | 4.0 | 4.0 | 4.0 | 4.0 | 4.0 |
| | Average particle size of abrasive grains (nm) | 340 | 340 | 341 | 342 | 340 | 25 |
| | Zeta potential of abrasive grains (mV) | 55 | 52 | 52 | 50 | −62 | 55 |
| Polishing rate (nm/min) | for silicon oxide film | 1280 | 1150 | 1090 | 1440 | 400 | 260 |

The invention claimed is:

1. A slurry comprising abrasive grains and a liquid medium,
   the abrasive grains including first particles and second particles being in contact with the first particles,
   the first particles containing ceria,
   the first particles having a negative zeta potential,
   the second particles containing a hydroxide of a tetravalent metal element, and
   the second particles having a positive zeta potential.

2. The slurry according to claim 1, wherein the hydroxide of a tetravalent metal element contains at least one selected from the group consisting of hydroxides of rare earth metal elements and hydroxide of zirconium.

3. The slurry according to claim 1, wherein a zeta potential of the abrasive grains is +10 mV or higher.

4. The slurry according to any claim 1, wherein a content of the abrasive grains is 0.01% to 10% by mass.

5. The slurry according to claim 1, wherein the slurry is used for polishing a surface to be polished containing silicon oxide.

6. A polishing method comprising a step of polishing a surface to be polished using the slurry according to claim 1.

7. The polishing method according to claim 6, wherein the surface to be polished contains silicon oxide.

* * * * *